United States Patent
Gardner et al.

[11] Patent Number: 6,140,167
[45] Date of Patent: Oct. 31, 2000

[54] HIGH PERFORMANCE MOSFET AND METHOD OF FORMING THE SAME USING SILICIDATION AND JUNCTION IMPLANTATION PRIOR TO GATE FORMATION

[75] Inventors: Mark I. Gardner, Cedar Creek; Mark C. Gilmer; Frederick N. Hause, both of Austin, all of Tex.

[73] Assignee: Advanced Micro Devices, Inc., Sunnyvale, Calif.

[21] Appl. No.: 09/135,826

[22] Filed: Aug. 18, 1998

[51] Int. Cl.$^7$ .................................................. H01L 21/336
[52] U.S. Cl. ....................... 438/197; 438/592; 438/585; 438/287
[58] Field of Search .................... 438/592, 586, 438/593, 585, 589, 259, 260, 270, 287, 299, 300, 197, 290

[56] References Cited

U.S. PATENT DOCUMENTS

| | | |
|---|---|---|
| 4,683,645 | 8/1987 | Naguib et al. . |
| 4,731,339 | 3/1988 | Ryan et al. . |
| 4,992,387 | 2/1991 | Tamura . |
| 5,120,668 | 6/1992 | Hsu et al. ................................ 438/41 |
| 5,252,502 | 10/1993 | Havemann . |
| 5,268,590 | 12/1993 | Pfiester et al. . |
| 5,445,977 | 8/1995 | Fujimoto . |
| 5,576,227 | 11/1996 | Hsu . |
| 5,583,067 | 12/1996 | Sanchez . |
| 5,646,435 | 7/1997 | Hsu et al. ................................ 257/382 |
| 5,654,570 | 8/1997 | Agnello . |
| 5,717,254 | 2/1998 | Hashimoto . |
| 5,821,594 | 10/1998 | Kasai . |
| 5,834,811 | 11/1998 | Huang . |
| 5,904,517 | 5/1999 | Gardner et al. ........................ 438/197 |
| 5,918,130 | 6/1999 | Hause et al. . |
| 5,955,759 | 9/1999 | Ismail et al. ............................ 257/332 |
| 5,960,270 | 9/1999 | Misra et al. ............................ 438/197 |
| 5,970,354 | 10/1999 | Hause et al. ............................ 438/305 |

FOREIGN PATENT DOCUMENTS

| | | |
|---|---|---|
| 0 614 226 | 9/1994 | European Pat. Off. . |
| 1923279 | 12/1970 | Germany . |
| 359034665 | 2/1984 | Japan . |
| 59-215774 | 12/1984 | Japan . |
| 360195978 | 10/1985 | Japan . |

OTHER PUBLICATIONS

Wolf, et al, "Silicon Processing For The VLSI Era, Voulme 1: Process Technology," Lattice Press, Snset Beach, California, 1986, pp. 384–406; and pp. 516–518.

Wolf, "Silicon Processing For The VLSI Era, Voulme 2: Process Technology," Lattice Press, Snset Beach, California, 1990, pp. 143–152.

*Primary Examiner*—Matthew Smith
*Assistant Examiner*—Victor Yevsikov
*Attorney, Agent, or Firm*—Kevin L. Daffer; Conley, Rose & Tayon

[57] ABSTRACT

A method is presented for forming a transistor wherein a silicide layer is formed upon an impurity region of a semiconductor substrate. After forming the silicide layer, a gate structure is preferably formed upon an exposed portion of the semiconductor substrate; however, the silicide layer may be formed after forming the gate structure. In order to form the gate structure, a layer of sacrificial material is first formed above the semiconductor substrate. An opening is then patterned through the layer of sacrificial material such that a portion of the semiconductor substrate is exposed. The gate structure preferably includes a metal gate conductor and a metal oxide gate dielectric.

19 Claims, 4 Drawing Sheets

HIGH PERFORMANCE MOSFET AND METHOD OF FORMING THE SAME USING SILICIDATION AND JUNCTION IMPLANTATION PRIOR TO GATE FORMATION

BACKGROUND OF THE INVENTION

1. Field of the Invention

This invention relates to semiconductor processing and, more particularly, to a transistor and method for forming the transistor by implementing silicidation of transistor unctions prior to forming the transistor gate structure. The gate structure preferably includes a high K value gate dielectric integrated with a metal gate electrode that is capable of withstanding high temperature anneals.

2. Description of the Related Art

Fabrication of a metal oxide semiconductor field-effect transistor (MOSFET) device is well known. MOSFETs are generally manufactured by placing an undoped polycrystalline silicon ("polysilicon") material over a relatively thin gate oxide. The polysilicon material and the gate oxide are then patterned to form a gate conductor with source/drain regions (i.e., junctions) adjacent to and on opposite sides of the gate conductor. The gate conductor serves to self-align impurities subsequently forwarded into the substrate on opposite sides of the gate conductor. The transistor junctions (i.e., source/drain areas) are therefore said to be self-aligned with the gate conductor.

Because of the increased desire to build faster and more complex integrated circuits, it has become necessary to increase the switching speed of transistors within the integrated circuits. One method of doing so is to reduce the transistor threshold voltage, $V_T$. Several factors contribute to $V_T$, one of which is the gate-to-substrate capacitance.

Threshold voltage $V_T$ of a transistor decreases as the gate-to-substrate capacitance increases. The capacitance per unit area, $C_{ox}$, of a gate dielectric can be expressed as:

$$C_{ox} = \epsilon / t_{ox}$$

where $\epsilon$ is the permittivity the gate oxide and $t_{ox}$ is the thickness of the gate oxide. The above equation for $C_{ox}$ demonstrates that the capacitance between two layers of conductive material separated by a dielectric is directly proportional to the permittivity of the dielectric and inversely proportional to the thickness of the dielectric.

By normalizing the permittivity, $\epsilon$, of a material to the permittivity of vacuum, $\epsilon_0$, the relative permittivity of a material can be determined. Relative permittivity, or dielectric constant, K, is typically used in place of permittivity. The dielectric constant of a material is defined as:

$$K = \epsilon / \epsilon_0$$

Silicon dioxide ("oxide") has a relatively low K of approximately 3.7 to 3.8. Consequently, the minimum value of $V_T$, and thus the transistor switching speed, is limited by the need to maintain a certain gate oxide thickness in order to promote capacitive coupling between the gate conductor and the substrate.

Because of the relationship between gate oxide thickness and threshold voltage, conventional transistors typically include an ultra thin gate oxide to increase the gate-to-substrate capacitance, and thereby lower $V_T$. The value of the gate-to-source voltage, $V_{GS}$, required to invert the channel underneath the gate conductor such that a drive current, $I_D$, flows between the source and drain regions of the transistor is decreased. Consequently, the switching speed (from off to on and vice versa) of the logic gates of an integrated circuit employing such transistors is faster, allowing the integrated circuit to quickly transition between logic states (i.e., operate at high frequencies).

Unfortunately, thin oxide films may break down when subjected to an electric field. Particularly, for a gate oxide that is less than 50 Å thick, it is probable that when $V_{GS}$ is equivalent to only 3V, electrons can pass through the gate oxide by what is known as the quantum mechanical tunneling effect. In this manner, a tunneling current may undesirably form between the semiconductor substrate and the gate conductor, adversely affecting the operability of the device. It is postulated that these electrons may become entrapped within the gate oxide by, e.g., dangling bonds. Consequently, a net negative charge density may form in the gate oxide. As the trapped charge accumulates with time, $V_T$ may shift from its design specification. Breakdown of the gate oxide may also occur at even lower values of $V_{GS}$ because of defects in the gate oxide. Such defects are unfortunately prevalent in relatively thin gate oxides. For example, a thin gate oxide often contains pinholes and/or localized voids due to the unevenness at which the oxide grows on a less than perfect silicon lattice. Low breakdown voltages also correlate with high defect density near the surface of the substrate.

Accordingly, the use of a high quality gate dielectric (i.e., one that is resistant to breakdown and has a high K value, etc.) is desired. Because of their high K values, metal oxides are sometimes used as the gate dielectric. Since metal oxides generally have much higher K values than does oxide, a metal oxide gate dielectric can be made thicker than a oxide gate dielectric while maintaining equivalent gate-to-substrate capacitance. Unfortunately, deposited metal oxides are typically not stoichiometric, may contain oxygen vacancies and, overall, are not sufficiently stable to be readily implemented in a production environment. Moreover, precisely depositing a uniformly thin layer of metal oxide is difficult.

In addition, the typical gate electrode is typically made from deposited polysilicon (as stated above). To lower the resistivity of the polysilicon gate, and thus increase the speed of the transistor, it is desirable that the entire polysilicon layer forming the gate be substantially doped. During a conventional transistor formation process, the polysilicon gate is typically doped at the same time as the source/drain areas in order to make the process more efficient. This simultaneous implantation may cause difficulties since the implant depth required for the gate is typically deeper than the desired implant depth of the source/drain areas. Provided spiking does not result, it is desirable to make the junctions (i.e., source/drain areas) as shallow as possible to reduce parasitic junction capacitance and resistance. A desired deeper channel depth takes into account dopants which may segregate and diffuse through the gate dielectric from the overlying gate conductor. Significant amounts of dopant diffusion can cause a threshold skew at the doped channel. Boron commonly used to dope p+ gates readily migrates though thin gate oxides (less than 125 angstroms) under high temperature processes (e.g., annealing at 900° C.). In order to avoid this migration, processing temperatures must be lowered. Such lowering, however, may result in insufficient distribution and/or anneal of the previously implanted dopants.

Furthermore, as the feature size in circuits decreases, the need to decrease the resistance and capacitance and thus the RC delay associated with interconnection paths becomes more urgent. For example, in submicron MOSFETs the interconnect RC delay can exceed delays due to gate switching. Doped polysilicon gates do not provide, by themselves, the low resistivity interconnection paths necessary for the fabrication of dense, high performance devices.

One way in which some of the problems of polysilicon gate conductors may be avoided is by substitution of aluminum for polysilicon. A gate conductor made of aluminum (or another metal) may partially block implant paths and prevent migration of impurities into the channel region. In addition, the greater conductivity of aluminum over polysilicon aids in reducing propagation delay. Unfortunately, the relatively low melting point of aluminum makes its use as a gate conductor undesirable if subsequent processing steps involve temperature cycles greater than approximately 500° C.

After the formation of the gate dielectric and gate electrode, ohmic contacts are typically formed between transistor source/drain regions and overlying interconnect. The formation of self-aligned suicides ("salicides") upon the source/drain regions as contact structures is commonly used to reduce the contact resistance at the contact/junction interface. In this process, oxide spacers placed laterally adjacent to the sidewalls of the gate conductor are often used to electrically separate the gate and source/drain regions. As device dimensions shrink, however, the likelihood of lateral formation of the silicide over the narrow oxide-spacer region increases. This phenomenon is referred to as silicide shorting or bridging.

Bridging can, in some instances, be prevented if the anneal cycle used to form the silicide is carefully controlled. A multiple step salicide formation process is often used for this purpose. In this process, a refractory metal such as titanium is deposited over the entire wafer. The metal film is then heated to a relatively low temperature in the presence of a nitrogen ambient in order to form a relatively high resistivity silicide over the source/drain regions. The lower temperature (<700° C.) helps inhibit cross-diffusion between silicon atoms within the spacers and/or gate conductor and metal atoms within the refractory metal layer. Afterwards, any unreacted metal is etched away, leaving a layer of metal silicide over the source/drain regions. A final, higher temperature anneal is then performed to produce a more stable, lower resistivity silicide.

Unfortunately, there are problems with this two-step annealing process. One problem is caused by removing the silicon substrate from the annealing chamber after the first anneal to etch away the remaining unreacted metal. Withdrawing the substrate from the annealing chamber, unfortunately, allows the growth of native oxides or the deposition of unwanted impurities upon the silicide layer. The presence of such impurities may have the detrimental effect of increasing the resistance of the silicide. Moreover, if the source/drain regions are highly doped, the relative lack of silicon atoms may make it necessary to increase the temperature of the first anneal above a desirable level.

Therefore, it would be desirable to develop a technique for fabricating a transistor that would allow the formation of a highly conductive silicide layer without silicide bridging. In addition, it would be desirable to create a technique that avoids some of the problems caused by a two-step salicide anneal. It would also be desirable to form a transistor that avoids the problems of impurity migration and lower conductivity generally associated with polysilicon gate electrodes, yet can withstand the high temperatures common in many processes (e.g., annealing). Furthermore, it would be advantageous to employ a metal oxide gate dielectric while avoiding the drawbacks of deposited metal oxides. The improved transistor would be one that avoids the problems of very thin oxides, yet provides high-speed operation necessary for modern integrated circuits.

SUMMARY OF THE INVENTION

The problems identified above are in large part addressed by the technique hereof for forming an improved transistor. In this technique, a silicide layer is preferably formed prior to the formation of the gate structure. This sequence allows the formation of a highly conductive silicide layer without silicide bridging. That is, the metal used to form the silicide layer is prevented from contacting the gate electrode and thus cannot electrically link the gate to adjacent source/drain regions. In addition, the silicide layer may be formed in a single annealing step, thus avoiding the unwanted growth of native oxides and deposition of impurities that may occur with two-step anneals. The silicide is preferably formed upon a previously implanted impurity region (which will subsequently be partitioned into source/drain regions) of a semiconductor substrate. Implant damage from the formation of the impurity region is preferably annealed before or during the formation of the silicide layer. Consequently, the gate conductor need not be exposed to the high temperatures necessary to anneal the implanted dopants, since the junction and silicide anneal steps occur before the metal gate conductor is deposited.

A transistor is presented having a gate structure that includes a metal gate conductor and a metal oxide gate dielectric. Unlike a conventional doped polysilicon gate electrode, a metal gate electrode requires no dopants to be rendered conductive. Consequently, the risk of dopants migrating from the gate electrode to the channel is substantially reduced. This benefit results from all high temperature anneals occurring before the gate conductor is formed. A metal gate electrode is beneficially more conductive than a doped polysilicon gate electrode. The metal oxide gate dielectric is preferably formed by a low temperature reaction at the interface between the metal gate conductor and a dielectric layer. A metal oxide gate dielectric is thereby grown and not deposited. As such, the metal oxide gate dielectric beneficially avoids many of the aforementioned problems of deposited metal oxides. The final transistor preferably has a relatively thick gate dielectric such that the transistor may operate in high performance ranges without the undesirable consequences of threshold skew or breakdown normally attributable to thin gate oxides. Additionally, a thick gate dielectric ensures the gate conductor rises well above the previously formed silicide, even though the bottom surface of the gate dielectric is elevationally lower than the silicide.

The metal gate conductor may be composed of a refractory metal so that, among other things, it can withstand somewhat high temperatures. The preferred metal is tungsten. A temperature cycle (low temperature anneal) is used to cause reaction of the metal gate conductor with an underlying dielectric layer. Annealing preferably causes metal atoms from the gate conductor and oxygen atoms form the dielectric layer to cross-migrate. A reaction preferably occurs at the interface between the metal gate conductor and the dielectric layer to form the metal oxide gate dielectric. In addition, oxygen atoms from the ambient may diffuse through the metal gate conductor to contribute to the reaction. During the annealing, at least a portion, and possibly the entire thickness, of the dielectric layer is consumed in the reaction. The metal oxide, along with any remaining portion of the dielectric layer, preferably serves as the gate dielectric.

Broadly speaking, a method is presented for forming a transistor wherein a silicide layer is formed upon an impurity region of a semiconductor substrate. After forming the silicide layer, a portion of the substrate can be exposed to a threshold adjust (or punch through) implant. Additionally, nitrogen atoms from a nitrogen and oxygen-bearing ambient may cause an oxide to grow on the exposed substrate. A metal gate conductor is then placed on the oxide, and reacted in a temperature cycle to cause a metal oxide gate dielectric to form at the interface between the metal conductor and the oxide.

In order to form the gate structure, a layer of sacrificial material is first formed above the semiconductor substrate. An opening is then patterned through the layer of sacrificial material such that a portion of the semiconductor substrate is exposed. A dielectric layer, preferably composed of oxide, may then be formed upon the exposed portion of the semiconductor substrate, and a metal gate conductor may be formed above the dielectric layer. Forming the metal gate conductor is preferably accomplished by first depositing a metal layer into the opening and upon an upper surface of the sacrificial material. The metal layer may then be polished to form the metal gate conductor exclusively within the opening and having an upper surface substantially coplanar with the upper surface of the layer of sacrificial material. The metal gate conductor and the dielectric layer may then be annealed such that the metal oxide gate dielectric is formed.

According to another embodiment, an opening is patterned through a sacrificial material and into a single crystal silicon substrate such that an exposed portion of the single crystal silicon substrate is formed. During patterning of the opening, a portion of a previously formed impurity region and a portion of a previously formed silicide layer may be etched away. A dielectric layer may be grown upon the exposed portion of the exposed, single crystal silicon substrate. A layer of metal is then preferably deposited upon the dielectric layer. By reacting a portion of the metal layer and a portion of the dielectric layer, a metal oxide gate dielectric may be formed at the interface between the metal layer and the dielectric layer. This reaction is preferably accomplished by annealing the metal layer and the dielectric layer in a oxygen-bearing ambient; however, a substantially inert ambient may be used instead. The gate conductor that remains after the reaction preferably includes the metal layer exclusive of the portion that partially forms the metal oxide layer. The gate dielectric after the reaction includes the metal oxide gate dielectric and the dielectric layer exclusive of the portion of the dielectric layer that partially forms the metal oxide gate dielectric. The reaction may continue for a time sufficient to consume approximately the entirety of the dielectric layer.

According to another embodiment, a transistor is formed. The transistor includes a silicide layer arranged upon an impurity region of a semiconductor substrate and a sacrificial material arranged upon the silicide layer. An opening is defined in the sacrificial material that also extends at least partially through the silicide layer and the impurity region. The transistor further includes a metal gate conductor stacked upon a metal oxide gate dielectric, both of which are arranged within the opening. In addition, a dielectric layer comprising oxide, and possibly nitrogen and oxide, may be interposed between the metal oxide gate dielectric and the semiconductor substrate. The metal gate conductor may primarily comprise tungsten, or any metal that can withstand metal-dielectric interaction which takes place during the anneal cycle. If the metal gate conductor is tungsten, then the metal oxide is primarily tungsten oxide preferably has a formula of $WO_x$, wherein x is between 1 and 3.

BRIEF DESCRIPTION OF THE DRAWINGS

Other objects and advantages of the invention will become apparent upon reading the following detailed description and upon reference to the accompanying drawings in which.

Figure 1:
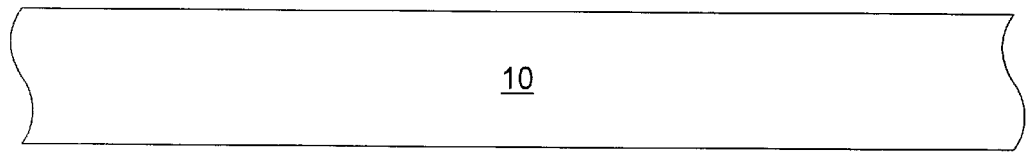
FIG. 1 is a partial cross-sectional view of a semiconductor topography.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning to FIG. 1, there is shown a semiconductor substrate 10 composed of single crystal silicon. Although not shown in the depicted cross-section of substrate 10, dielectric isolation regions, such as trench isolation regions, may be arranged spaced distances apart within the substrate for dielectrically isolating ensuing active areas.

Figure 2:
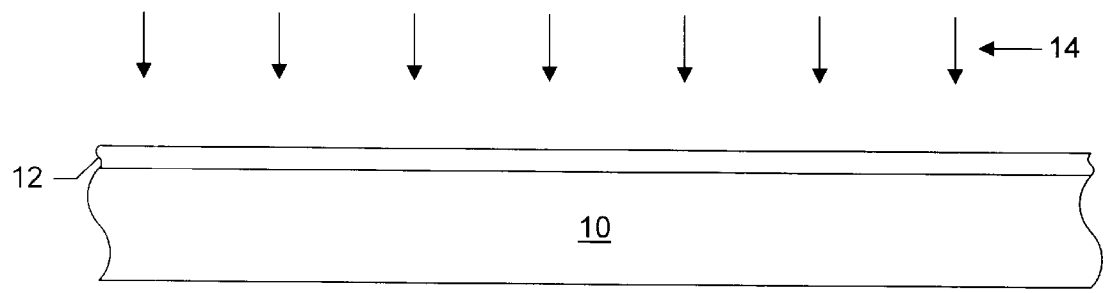
FIG. 2 is a partial cross-sectional view of the semiconductor topography, wherein dopants are implanted such that an impurity region is formed within a semiconductor substrate according to an initial processing step subsequent to FIG. 1.

FIG. 2 depicts the implantation of dopants 14 into semiconductor substrate 10 to form impurity region 12. Dopants 14 may be either n-type or p-type. Appropriate n-type dopants include, but are not limited to, arsenic or phosphorus. Appropriate p-type dopants, include, but are not limited to, boron or boron difluoride. P-type species are implanted if a p-channel transistor is being formed, and n-type species are implanted if an n-channel transistor is being formed. Preferably, dopants 14 are implanted at an energy sufficient to ensure region 12 depth is sufficiently shallow, and not bound by depth demands of a channel region.

Figure 3:
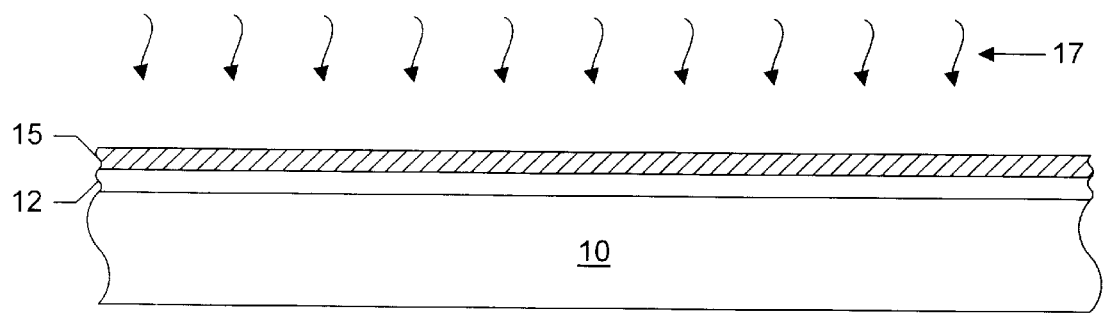
FIG. 3 is a partial cross-sectional view of the semiconductor topography, wherein a layer of refractory metal deposited over the impurity region is annealed according to a processing step subsequent to FIG. 2.

FIG. 3 shows an annealing process by which a refractory metal layer 15, previously deposited across semiconductor substrate 10, is exposed to thermal radiation 17. This annealing may cause a silicide reaction to occur everywhere that metal is in contact with silicon; preferably, silicide layer 16 forms primarily upon impurity region 12. Preferred metals for refractory metal layer 15 include cobalt, titanium, and nickel. The anneal cycle can be at relatively high temperatures exceeding 1000 degrees C., and is preferably performed in a single cycle.

Figure 4:
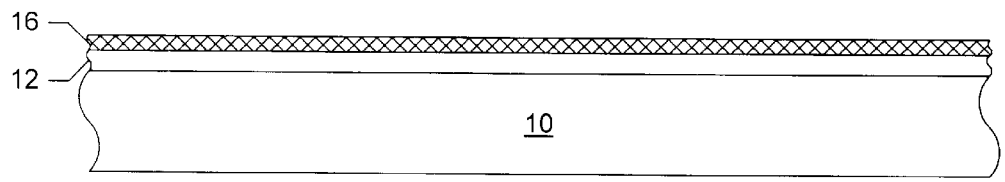
FIG. 4 is a partial cross-sectional view of the semiconductor topography wherein a silicide layer is formed upon the impurity region according to a processing step subsequent to FIG. 3.

As shown in FIG. 4, silicide layer 16 is preferably formed after refractory metal layer 15 is exposed to thermal radiation 17 for a sufficient time. Silicide layer 16 is preferably formed before formation of a gate structure (described below), but may also be formed afterwards. Following the silicide formation, a selective etch preferably removes any unreacted metal without attacking the silicide.

Figure 5:
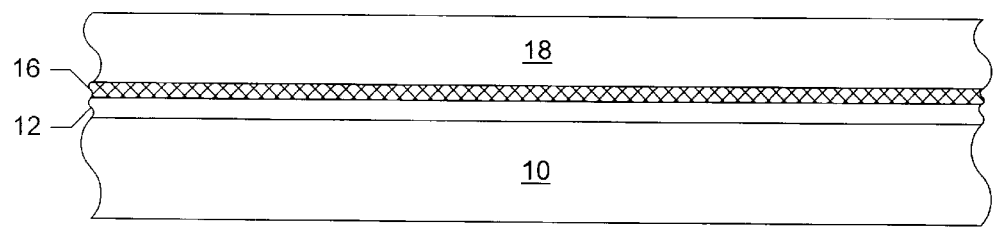
FIG. 5 is a partial cross-sectional view of the semiconductor topography, wherein a layer of sacrificial material is deposited according to a processing step subsequent to FIG. 4.

Referring now to FIG. 5, a process step is shown in which sacrificial material layer 18 is formed upon silicide layer 16. In an embodiment where the silicide layer is formed after the gate structure, sacrificial material layer 18 may be formed directly upon semiconductor substrate 10. Sacrificial material layer 18 is preferably blanket deposited across semiconductor substrate 10 by chemical vapor deposition ("CVD") methods. Sacrificial material 18 preferably is composed of oxide, but may be composed of other materials such as silicon nitride. Sacrificial material layer 18 preferably serves to provide a support for the subsequent formation of a gate structure. In this manner, sacrificial material layer 18 may help to properly align a gate structure above the impurity region. However, sacrificial material 18 may be disposed of after the gate structure has been formed.

Figure 6:
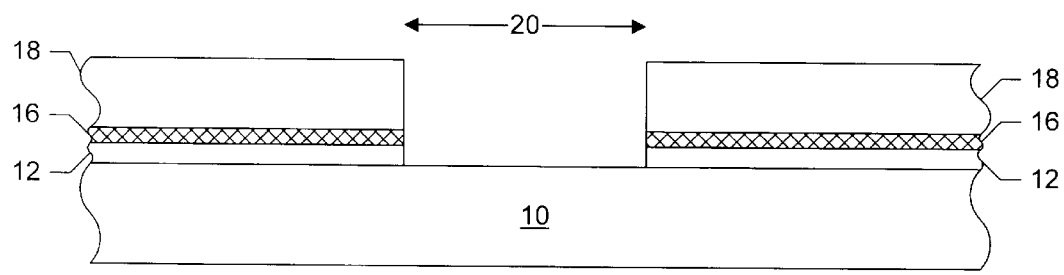
FIG. 6 is a partial cross-sectional view of the semiconductor topography, wherein an opening is patterned through the layer of sacrificial material, the silicide layer, and the impurity region such that a portion of the semiconductor substrate is exposed according to a processing step subsequent to FIG. 5.

As illustrated in FIG. 6, an opening 20 is then patterned through sacrificial material layer 18, silicide layer 16, and at least partially through impurity region 12. Consequently, a portion of semiconductor substrate 10 is exposed. A dry etch is preferably used to anisotropically etch the above-described portions such that opening 20 has sidewalls that are substantially vertical. Opening 20 may extend entirely through impurity region 12 such that impurity region 12 is divided into a pair of source/drain regions. If opening 20 instead only extends partially through impurity region 12, then subsequent dopant implantation into the exposed portion of semiconductor substrate 10 may serve to divide impurity region 12 into source/drain regions. Preferably, implant steps for threshold adjust and punchthrough prevention are performed after patterning an opening and before formation of a gate dielectric. However, at least one of these implants may be performed after formation of an initial dielectric layer upon the exposed portion of semiconductor substrate 10.

Figure 7:
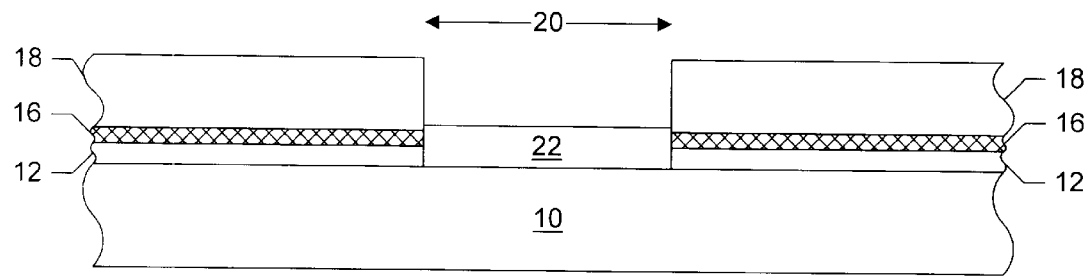
FIG. 7 is a partial cross-sectional view of the semiconductor topography, wherein a dielectric layer is formed upon the exposed portion of the semiconductor substrate according to a processing step subsequent to FIG. 6.

FIG. 7 depicts the formation of dielectric layer 22 upon the exposed portion of semiconductor substrate 10. Dielectric layer 22 may be deposited, but is preferably grown. Growth of dielectric layer 22 may occur by either dry or wet oxidation. Dielectric layer 22 is preferably grown in an ambient containing oxygen-bearing and nitrogen-bearing gases (e.g., NO, $N_2O$, and/or $NH_3$ gas may be present) such that dielectric layer 22 includes oxynitride. As a result, dielectric layer 22 may contain, for example, 2–5% nitrogen distributed throughout. Nitrogen within dielectric layer 22 preferably acts as a barrier to dopant migration. Alternately, dielectric layer 22 may be grown in a substantially pure oxygen ambient such that dielectric layer 22 is composed of oxide. A portion of dielectric layer 22 may be etched away after initial formation if necessary.

Figure 8:
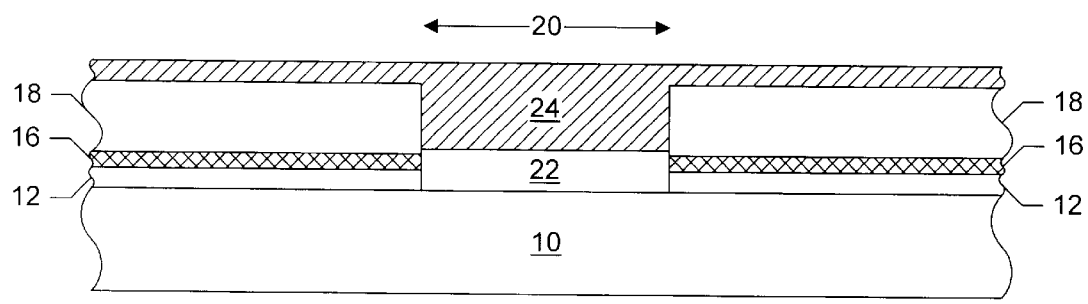
FIG. 8 is a partial cross-sectional view of the semiconductor topography, wherein a metal layer is deposited according to a processing step subsequent to FIG. 7.

Referring now to FIG. 8, a layer of metal-based material is preferably formed above semiconductor substrate 10. Metal layer 24 is preferably deposited by CVD, but may also be deposited by other methods such as sputter deposition. After deposition, metal layer 24 is preferably 1000–2000 angstroms thick. Metal layer 24 preferably substantially fills opening 20 and may cover a large portion of sacrificial material layer 18. Metal layer 24 may be composed of a refractory metal, preferably tungsten, so that it may withstand high temperature anneals.

Figure 9:
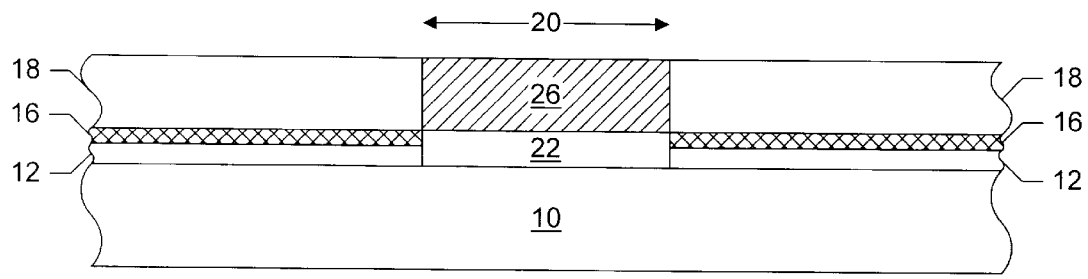
FIG. 9 is a partial cross-sectional view of the semiconductor topography, wherein the metal layer is polished to form a metal gate conductor according to a processing step subsequent to FIG. 8.

As shown in FIG. 9, metal layer 24 is preferably polished to form metal gate conductor 26. Polishing of metal layer 24 is preferably undertaken by chemical mechanical polishing ("CMP"). Polishing may be used to reduce the upper surface of metal layer 24 such that it is substantially coplanar with the upper surface of sacrificial material layer 18. Polishing of metal layer 24 preferably occurs before the annealing reaction used to form a metal oxide gate dielectric (described below), but may occur afterwards. After polishing, metal gate conductor 26 is preferably contained exclusively within opening 20.

Figure 10:
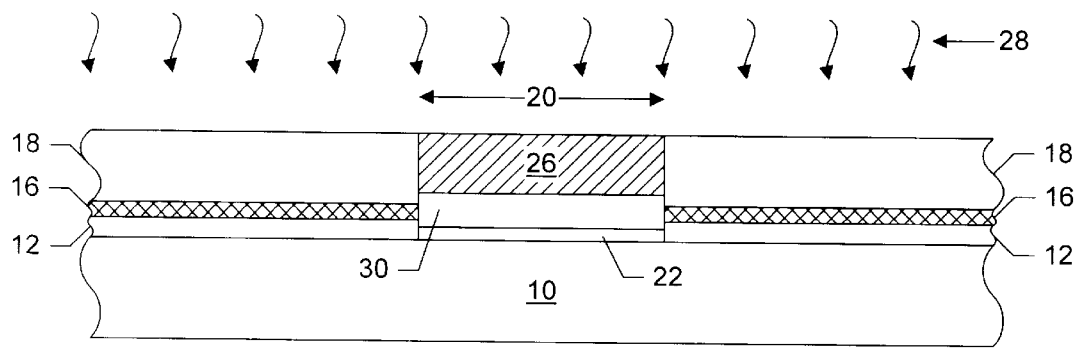
FIG. 10 is a partial cross-sectional view of the semiconductor topography, wherein a layer of metal oxide is formed at the interface of the metal gate conductor and the dielectric layer according to a processing step subsequent to FIG. 9.

FIG. 10 depicts an annealing process in which the semiconductor topography is exposed to thermal radiation 28. Annealing preferably occurs in a rapid thermal processing chamber at temperatures between 700° and 1000° C. A tube furnace may also be used to carry out the annealing step. Whatever the technique, the ambient in which annealing occurs is preferably oxygen-bearing, but may instead be substantially inert. Thermal radiation 28 preferably causes downward diffusion of mobile metal atoms from metal gate conductor 26 into dielectric layer 22; thermal radiation 28 also preferably causes upward diffusion of oxygen from dielectric layer 22 into metal gate conductor 26. Oxygen atoms from the ambient, if present, may diffuse through metal gate conductor 26 to the interface between metal gate conductor 26 and dielectric layer 22. Preferably, metal atoms and oxygen atoms react at the interface between metal gate conductor 26 and dielectric layer 22 to form metal oxide gate dielectric 30. If metal gate conductor 26 is composed of tungsten, then metal oxide gate dielectric 30 preferably is composed of tungsten oxide having the formula $WO_x$, wherein x is preferably between 1 and 3. In this case, metal oxide gate dielectric 30 preferably has a K value of about 100. Metal oxide gate dielectric 30 is preferably 125–375 angstroms thick.

Figure 11:
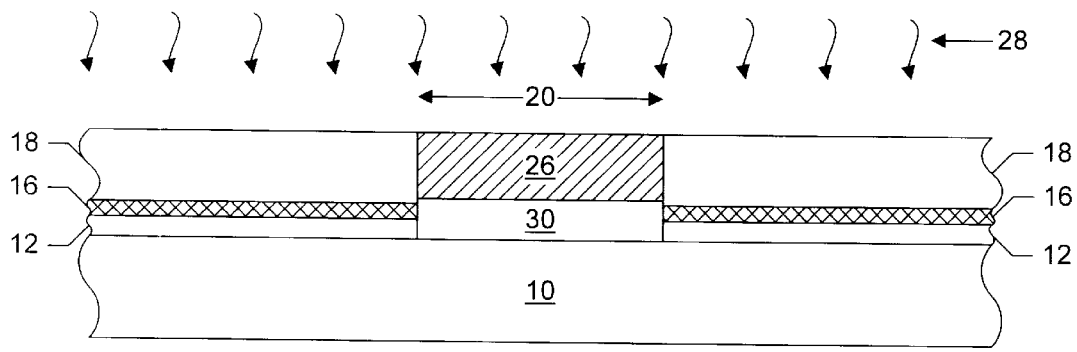
FIG. 11 is a partial cross-sectional view of the semiconductor topography, wherein a layer of metal oxide is formed at the interface of metal gate conductor and the dielectric layer such that the entirety of the dielectric layer is consumed according to a processing step subsequent to FIG. 9.

Although FIG. 10 depicts an embodiment in which a small portion of dielectric layer 22 remains upon termination of the anneal step, dielectric layer 22 may be completely consumed by the annealing reaction. FIG. 11 illustrates an embodiment in which dielectric layer 22 is entirely depleted. Consumption of the entirety of dielectric layer 22 may be beneficial because metal oxide gate dielectric 30 preferably has a considerably higher K value than dielectric layer 22. For example, if metal oxide gate dielectric 30 is tungsten oxide and dielectric layer 22 is oxide, then metal oxide gate dielectric 30 may have a K value approximately 25 times greater than dielectric layer 22.

The final gate dielectric preferably includes metal oxide gate dielectric 30 and any remaining portions of dielectric layer 22. The final gate dielectric is preferably of sufficient thickness that silicide layer 16 is prevented from contacting metal gate conductor 26. In addition, dielectric layer 22 may have a K value of about 4 and metal oxide gate dielectric may have a K value of about 100. The capacitance per unit area of the final gate dielectric depends, by the formulas given above, on the respective thickness and K value of each layer that constitutes the final gate dielectric. The thicknesses of metal oxide gate dielectric 30 and dielectric layer 22 (if any remains) preferably are such that the final gate dielectric has a capacitance per unit area equivalent to 5–15 angstroms of oxide.

Figure 12:
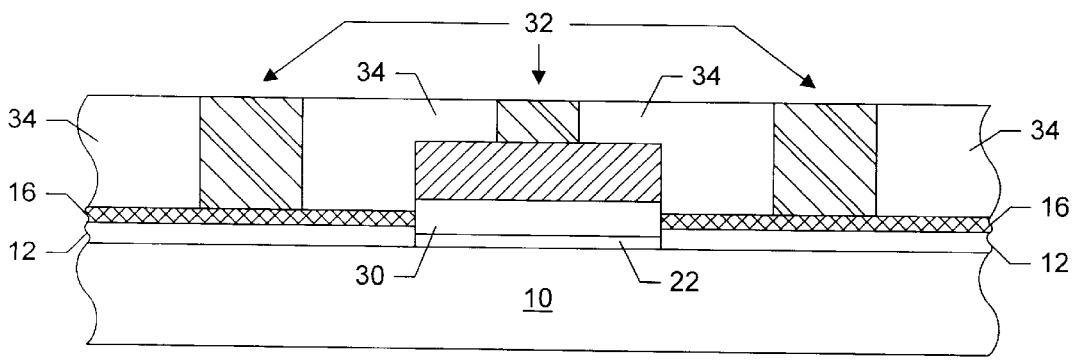
FIG. 12 is a partial cross-sectional view of the semiconductor topography, wherein an interlevel dielectric is deposited and plugs formed according to a processing step subsequent to FIG. 10.

FIG. 12 depicts the formation of plugs 32 and interlevel dielectric 34. Plugs 32 preferably connect the divided portions of impurity region 12 to overlying interconnect. Plugs 32 may be composed of a metal, preferably Cu, W, Al, or Ta. Interlevel dielectric 34 may be formed by depositing a dielectric material above sacrificial material layer 18; alternately, sacrificial material layer 18 may be substantially removed before deposition of the dielectric material that forms interlevel dielectric 22. Removal of sacrificial material layer 18 may be undertaken if, for example, it is desired to form a silicide layer after formation of the gate structure.

It will be appreciated by those skilled in the art having the benefit of this disclosure that this invention is believed to provide a method for forming a silicide layer prior to forming a gate structure. In addition, the present invention is believed to provide a method for forming a transistor having a gate dielectric at least partially composed of metal oxide. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for forming a transistor, comprising:
   forming a silicide layer upon an impurity region of a semiconductor substrate;
   forming a layer of sacrificial material above the semiconductor substrate;
   patterning an opening through the layers of sacrificial material and silicide and into the semiconductor substrate such that an exposed portion of the semiconductor substrate is formed; and
   forming a metal gate conductor upon a metal oxide gate dielectric exclusively within the opening and upon the exposed portion of the semiconductor substrate.

2. The method of claim 1, wherein said forming a silicide layer occurs prior to said forming the metal gate conductor or the metal oxide gate dielectric.

3. The method of claim 2, wherein said forming a silicide layer comprises annealing, in a single cycle, a refractory metal layer arranged above the impurity region at a temperature exceeding 1000° C. to form the silicide layer.

4. The method of claim 1, wherein said forming the metal oxide gate dielectric comprises forming a dielectric layer comprising oxynitride upon the exposed portion of the semiconductor substrate.

5. The method of claim 1, wherein said forming the metal gate dielectric comprises:
   forming a dielectric layer upon the exposed portion of the semiconductor substrate and within the confines of the opening;
   forming the metal gate conductor above the dielectric layer; and
   heating the metal gate conductor and the dielectric layer such that the metal oxide gate dielectric is formed at an interface between the metal gate conductor and the dielectric layer.

6. The method of claim 5, wherein said forming the metal gate conductor occurs prior to said heating and comprises:
   depositing a metal layer into the opening and upon an upper surface of the layer of sacrificial material; and
   polishing the metal layer to form the metal gate conductor exclusively within the opening and having an upper surface substantially coplanar with the upper surface of the layer of sacrificial material.

7. The method of claim 1, wherein the opening extends substantially through the impurity region such that the impurity region is divided into source/drain regions.

8. The method of claim 1, wherein said metal gate conductor primarily comprises tungsten, and wherein said metal oxide primarily comprises tungsten oxide having a formula of $WO_x$, and wherein x is between 1 and 3.

9. The method of claim 1, wherein said patterning an opening further comprises patterning the opening through the impurity region such that the impurity region is divided by the opening into a pair of source/drain regions.

10. The method of claim 1, wherein said forming a layer of sacrificial material above the semiconductor substrate comprises depositing the layer of sacrificial material upon the silicide layer.

11. A method for forming a transistor, comprising:
    patterning an opening through a sacrificial material and partially into a single crystal silicon substrate such that an exposed portion of the single crystal silicon substrate is formed;
    growing a dielectric layer upon the exposed portion of the single crystal silicon substrate;
    depositing a metal layer upon the dielectric layer; and
    reacting a portion of the metal layer and a portion of the dielectric layer such that a metal oxide gate dielectric is formed beneath the metal layer at an interface between the metal layer and the dielectric layer.

12. The method of claim 11, wherein said patterning an opening comprises etching a portion of an impurity region within the single crystal silicon substrate and a portion of a silicide layer formed upon the impurity region.

13. The method of claim 12, wherein said patterning an opening further comprises etching through the impurity region within the single crystal silicon substrate such that the impurity region is divided by the opening into a pair of source/drain regions.

14. The method of claim 11, wherein said reacting comprises annealing the metal layer and the dielectric layer in an inert ambient.

15. The method of claim 11, wherein said reacting comprises annealing the metal layer and the dielectric layer in an oxygen-bearing ambient.

16. The method of claim 11, wherein said reacting comprises forming a metal gate conductor comprising the metal layer exclusive of the portion that partially forms the metal oxide gate dielectric.

17. The method of claim 11, wherein said reacting comprises forming a gate dielectric comprising the metal oxide gate dielectric and the dielectric layer exclusive of the portion of the dielectric layer that partially forms the metal oxide gate dielectric.

18. The method of claim 17, wherein the gate dielectric comprises a capacitance per unit area equivalent to 5–15 angstroms of oxide.

19. The method of claim 11, wherein said reacting continues for a time sufficient to consume the entirety of said dielectric layer.

* * * * *

UNITED STATES PATENT AND TRADEMARK OFFICE
CERTIFICATE OF CORRECTION

PATENT NO. : 6,140,167
DATED : Oct. 31, 2000
INVENTOR(S) : Gardner et al.

It is certified that error appears in the above-identified patent and that said Letters Patent is hereby corrected as shown below:

In the Title:

In the title, please delete the word "SILICIDATION" and substitute therefor --SALICIDATION--.

Signed and Sealed this

Twenty-ninth Day of May, 2001

Attest:

NICHOLAS P. GODICI

*Attesting Officer*     *Acting Director of the United States Patent and Trademark Office*